United States Patent [19]
Williford

[11] 4,085,380
[45] Apr. 18, 1978

[54] BIQUAD RC ACTIVE FILTER

[75] Inventor: Jerry G. Williford, Tustin, Calif.

[73] Assignee: Rockwell International Corporation, El Segundo, Calif.

[21] Appl. No.: 745,031

[22] Filed: Nov. 26, 1976

[51] Int. Cl.² ............................................. H03F 1/36
[52] U.S. Cl. .................................... 330/107; 330/51; 330/109
[58] Field of Search .......................... 330/51, 107, 109

[56] References Cited
PUBLICATIONS

Thomas, Lee C. "The Biquad": (Part I & Part II) IEEE Transactions on Circuit Theory, pp. 350-361, May 1971.

*Primary Examiner*—Lawrence J. Dahl
*Attorney, Agent, or Firm*—Howard R. Greenberg; H. Fredrick Hamann

[57] ABSTRACT

An RC active filter affords great flexibility for realizing biquadratic transfer functions, albeit with an extremely simple design comprising two operational amplifiers having plural inputs and outputs.

12 Claims, 1 Drawing Figure

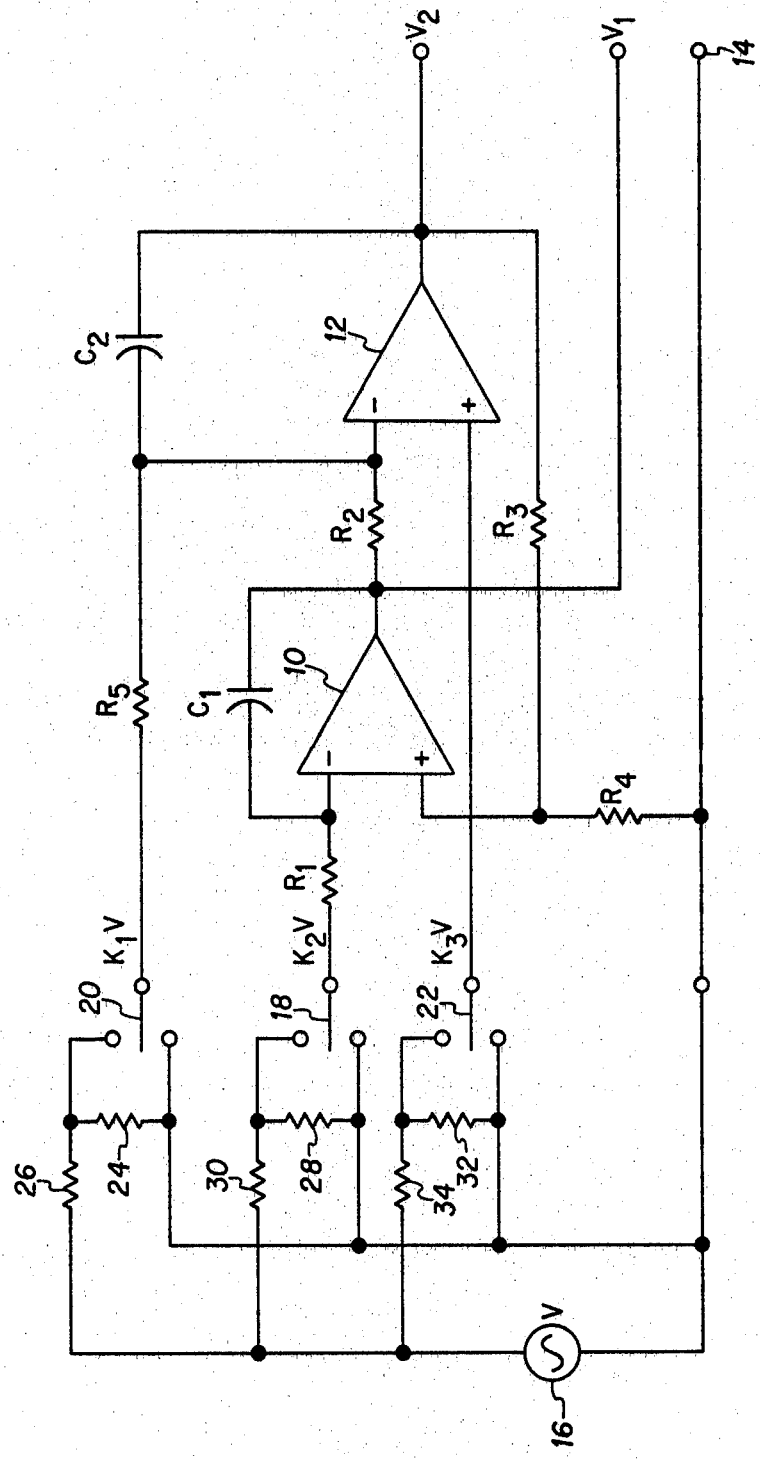

BIQUAD RC ACTIVE FILTER

BACKGROUND OF THE INVENTION

The subject invention was made under or in the course of a contract with the National Security Agency.

The invention herein pertains generally to electronic filters and in particular to those of the RC active type.

Although RC active filters have been used heretofore for simulating biquadratic transfer functions, they all display various shortcomings, the most notable example being the use of numerous components which adds to their overall cost. Such a filter is depicted in an article entitled "Design Formulas For Active RC Filters Using Operational Amplifier Biquad" which appeared in the July 24, 1969 issue (Vol. 5, No. 15) of Electronics Letters at page 339.

With the foregoing in mind, it is a primary object of the present invention to provide a new and improved RC active filter for simulating biquadratic transfer functions.

It is a further object of the present invention to provide such a new and improved filter having a minimal number of components.

It is still a further object of the present invention to provide such a new and improved filter of simplified design that does not sacrifice flexibility and versatility of utilization.

The foregoing objects as well as others and the means by which they are achieved through the present invention may best be appreciated by referring to the Detailed Description of the Preferred Embodiment which follows hereinafter together with the single appended drawing which is a schematic diagram thereof.

BRIEF DESCRIPTION OF THE INVENTION

In accordance with the stated objects, the RC active filter of the invention comprises a pair of operational amplifiers, each having a capacitor interconnecting its output with its inverting input. A resistor interconnects the output of a first one of the amplifiers with the inverting input of the second amplifier while another resistor is connected to the inverting input of the first amplifier. A feedback path is provided between the output of the second amplifier and the non-inverting input of the first amplifier. Means are provided for applying the signal to be filtered (referenced to a common terminal) to at least one of the following: the inverting input of the first amplifier via the resistor connected thereto and one or both of the inputs of the second amplifier. The output signal which is taken from either of the two amplifier outputs is made to assume the desired transfer function equation by applying the proper input signals and employing appropriate capacitor and resistor values including those for a resistor interconnecting the non-inverting input of the first amplifier with the common terminal and another resistor in the signal path to the inverting input of the second amplifier when necessary. By applying signals to the inputs of the two amplifiers which are either equal in magnitude to the signal to be filtered or zero, a filter of simple design to afforded which is capable of performing low, high or bandpass filtering.

DETAILED DESCRIPTION OF THE PREFERRED EMBODIMENT

As shown in the appended drawing, the RC active filter of the invention comprises a pair of operational amplifiers 10 and 12, each having a feedback capacitor, $C_1$ and $C_2$, respectively, interconnecting its output with its inverting (−) input. Amplifier 10 has a resistor $R_1$ connected to its inverting input while a resistor $R_2$ interconnects its output with the inverting input of amplifier 12. A feedback resistor $R_3$ interconnects the output of amplifier 12 with the noninverting (+) input of amplifier 10, while another resistor $R_4$ connects that input to a common terminal 14 which serves as a reference point for all signals. A resistor $R_5$ is connected to the inverting input of amplifier 12. The filtered output signal is derived from either one of the outputs of amplifiers 10 and 12, respectively, designated as $V_1$ and $V_2$ to be explained in detail shortly.

The signal which is to be filtered is designated V for the voltage produced at the output of a voltage source represented symbolically by generator 16. The signal V is applied to the filter through one or more of three paths dependent on the position of symbolic switches 18, 20 and 22 which lead respectively to the inverting inputs of amplifiers 10 and 12 and the non-inverting input of amplifier 12. When placed in a lower position, the switches 18–22 connect their respective inputs to the common terminal 14 so that no signal can be applied thereto. Placement of a switch in the upper position connects its respective input to a divider circuit to which the signal V is applied so as to permit the signal which is actually applied to its input to be attenuated by a desired amount. Thus, when placed in its upper position, switch 20 applies a signal $K_1V$ to its input which is obtained by employing resistors 24 and 26 in its associated divider circuit whose respective resistor values are chosen to afford a ratio of $K_1$ equal to the value of resistor 24 divided by their sum. Similarly, the voltage divider comprising resistors 28 and 30 affords a scaling factor of $K_2$ so as to apply a signal $K_2V$ to the inverting input of amplifier 10 via resistor $R_1$ when associated switch 18 is placed in its upper position. Likewise, the voltage divider comprising resistors 32 and 34 affords a scaling factor $K_3$ so as to apply a signal $K_3V$ to the non-inverting input of amplifier 12 when associated switch 22 is located in its upper position. Although, as will be appreciated hereinafter, K factor values of less than unity will normally appertain, greater than unity values may be obtained with the depicted divider circuit arrangement if desired, by inserting an amplifier in series with the desired signal path.

Applying superposition and the assumptions normally made for operational amplifiers (viz. infinite gain and input impedance and zero degree phase shift), the transfer function for the output signals (in terms of the conventional S operator) as a function of the input signal (where V represents the actual source function) will be seen to be equal to the following:

$$\frac{V_1}{V}(S) = \frac{d\left[K_3S^2\left[a\left(K_3 - \frac{K_2}{d}\right) + CK_3 - \frac{K_1}{R_5C_2}\right]S + a\left(CK_3 - \frac{K_1}{R_5C_2}\right)\right]}{S^2 + bdS + abd}$$

and $$\frac{V_2}{V}(S) = \frac{K_3 S^2 + (CK_3 - \frac{K_1}{R_5 C_2}) S + abK_2}{S^2 + bdS + abd}$$

where, $a = 1/R_1 C_1$; $b = 1/R_2 C_2$; $c = 1/R_2 C_2 + 1/R_5 C_2$, and $d = R_4/R_3 = R_4$.

These transfer functions have the form:

$$F(s) = \frac{AS^2 + BS + C}{S^2 + BS + E}$$

which is the generalized representation for any biquadratic equation. Since this generalized equation has five coefficients A–E which must be established and each transfer function contains nine controllable parameters, namely, $K_1 - K_3$, $R_1 - R_5$ and $C_1 - C_2$, it will be readily apparent that any desired equation is realizable by the disclosed filter through either or both of its transfer functions. This degree of freedom in using nine parameters to define five coefficients appertains in theory, however, since in actually designing a filter, one would ordinarily try to select values for $C_1$ and $C_2$ (which are normally the most expensive and physically largest components of the filter) to be as small as practicable considering stray capacitances and the like. Moreover, to simplify the circuit one would ordinarily want to use values of zero or unity for the factors $K_1$–$K_3$ so as to totally eliminate the resistors 24–34 comprising the divider circuits (resistors 24, 28 and 32 becoming open circuits and resistors 26, 30 and 34 short circuits). This then leaves the values for the five resistors $R_1$–$R_5$ to establish the five desired coefficients. In this connection, if $d$ is also made equal to unity, then $R_3$ and $R_4$ become short and open circuits, respectively, thus reducing the filter to two operational amplifiers 10 and 12, two capacitors $C_1$–$C_2$ and three resistors $R_1$, $R_2$ and $R_5$.

The flexibility and versatility of the disclosed filter may be appreciated by considering how it may be facilely employed to effectuate simple low, high and bandpass filtering with $d$ equal to unity so as to eliminate resistors $R_3$ and $R_4$. For example, if $K_1$ and $K_3$ are both made equal to zero and $K_2$ made equal to unity, the transfer function $V_2/V$ reduces to $ab/(S^2 + bS + ab)$ which it will be recognized is the form for a simple lowpass filter (response at D.C. but not high frequencies). It is to be noted that in this case since $K_1$ equals zero and the inverting input of operational amplifier 12 has other reference sources, $R_5$ can be eliminated as an open circuit, thus reducing the filter even more to only two resistors, namely, $R_1$ and $R_2$.

Assuming that $K_1$ and $K_3$ are both equal to zero again with $K_2$ equal to one, then a simple bandpass filter may be realized by deriving the output signal as $V_1$ at the output of amplifier 10 since its transfer function will be $-aS/(S^2 + bS + ab)$ having a zero response at D.C. and high frequency levels but not in between.

By setting $K_1 = 1$, $K_2 = 0$, $K_3 = \frac{1}{2}$ and $R_5$ equal to $R_2$, the transfer function for $V_2/V$ is $K_3 S^2/S^2 + bS + ab$ which is the form for a simple highpass filter.

The three foregoing design situations are summarized by the following table for the convenience of the reader:

| SIMPLIFIED FILTER DESIGN ($d = 1$) | | | |
|---|---|---|---|
| Item | Lowpass | Bandpass | High Pass |
| $K_1$ | 0 | 0 | 1 |
| $K_2$ | 1 | 1 | 0 |
| $K_3$ | 0 | 0 | $\frac{1}{2}$ |
| Output | $V_2$ | $V_1$ | $V_2$ |
| Transfer Function | $\dfrac{ab}{S^2 + bS + ab}$ | $\dfrac{-aS}{S^2 + bS + ab}$ | $\dfrac{K_3 S^2}{S^2 + bS + ab}$ |

The simplified filters just described represent a biquadratic equation having only a single term in the numerator. A more generalized case which will be appreciated by those skilled in the art occurs when two or all three terms in the numerator are subsistent. For example, by preferably making $K_1$ and $K_2$ equal to unity (to minimize the components) and allowing $K_3$ to assume a desired value between zero and unity, it will be seen that a lowpass filter with finite zeroes can be realized by $V_2$ at the output of amplifier 12 while a high pass filter with finite zeroes can be realized by $V_1$ at the output of amplifier 10. In such case the zeroes can be made to be on the jw axis in the complex plane by setting the coefficient of S in the numerator to zero by appropriate choice of values for the related parameters. The equations for the low and high pass filters then become, respectively:

$$\frac{V_2(S)}{V} = \frac{K_3 S^2 + ab}{S^2 + bdS + abd} \ \& \ V_1/V(S) =$$

$$\frac{dK_3 S^2 + ad (CK_3 - K_1/R_5 C_2)}{S^2 + bds + abd}$$

which will be seen to produce respones at D.C., higher frequencies and zero at some desired intermediate frequency. By appropriate parameter design, the higher frequency response can be attenuated over the D.C. response for the lowpass filter and vice versa for the high pass filter.

Thus, as the foregoing demonstrates, the RC active filter of the invention affords great simplicity of design while still affording great flexibility and versatility for simulating any biquadratic equation. Since undoubtedly modifications to the detailed description herein may occur to those skilled in the art which will not necessarily constitute departures from the scope and spirit of the invention, the subject disclosure is intended to be merely exemplary and not circumscriptive of the invention as it will now be claimed hereinbelow.

What is claimed is:

1. A biquad RC active filter, comprising:
   a pair of operational amplifiers, each having an inverting and non-inverting input;
   a pair of capacitors, each being connected between the output and inverting input of a different one of said amplifiers;
   a first resistor connected to the inverting input of a first one of said amplifiers;

a second resistor interconnecting the output of said first amplifier with the inverting input of the second one of said amplifiers;

feedback circuit means interconnecting the output of said second amplifier with the non-inverting input of said first amplifier;

a common terminal, and input circuit means for applying a signal referenced to said common terminal to at least one of the inputs of said amplifiers with the exception of the non-inverting input of said first amplifier.

2. The filter of claim 1 wherein said input circuit means comprises a resistor in the signal path to the inverting input of said second amplifier.

3. The filter of claim 1 wherein said input circuit means comprises means for individually altering the amplitude of the signal that is applied to the individual inputs of said amplifiers.

4. The filter of claim 1 wherein said feedback circuit means is a resistor and further including a resistor interconnecting the non-inverting input of said first amplifier with said common terminal.

5. The filter of claim 2 wherein said input circuit means applies the signal either to both inputs of said second amplifier simultaneously or to the input of said first amplifier exclusively.

6. The filter of claim 1 wherein the signal is applied exclusively to and the output signal is derived from the output of said first amplifier.

7. The filter of claim 1 wherein the signal is applied exclusively to said first amplifier and the output signal is derived from the output of said second amplifier.

8. The filter of claim 7 wherein said feedback circuit means is a short circuit.

9. The filter of claim 1 wherein the signal is applied to all three inputs of said amplifiers and the output signal is derived from the output of said first amplifier.

10. The filter of claim 1 wherein the signal is applied to the inverting inputs of both of said amplifiers and is attenuated before being applied to the non-inverting input of said second amplifier.

11. The filter of claim 1 wherein the output signal is derived from the output of said first amplifier.

12. The filter of claim 10 wherein the output signal is derived from the output of said second amplifier.

* * * * *

UNITED STATES PATENT AND TRADEMARK OFFICE
CERTIFICATE OF CORRECTION

PATENT NO. : 4,085,380

DATED : Apr. 18, 1978

INVENTOR(S) : Jerry G. Williford

It is certified that error appears in the above-identified patent and that said Letters Patent are hereby corrected as shown below:

IN THE SPECIFICATION

Column 1, line 61, after "design" delete "to" and substitute therefor -- is --.

Column 2, lines 62-65, delete entire equation and substitute therefor $$\frac{V_1}{V}(S) = d \frac{\left[K_3 S^2 \left[\frac{a(K_3-K_2)}{d} + CK_3 - \frac{K_1}{R_5 C_2}\right] S + a\left(CK_3 - \frac{K_1}{R_5 C_2}\right)\right]}{S^2 + bdS + abd}$$

-- .

and -- .

Column 3, lines 15-16, delete entire equation and substitute therefor $$F(s) = \frac{AS^2 + BS + C}{S^2 + DS + E}$$

-- .

UNITED STATES PATENT OFFICE
CERTIFICATE OF CORRECTION

Patent No. 4,085,380        Dated April 18, 1978

Inventor(s) Jerry G. Williford

It is certified that error appears in the above-identified patent and that said Letters Patent are hereby corrected as shown below:

Column 4, line 44, delete "respones" and substitute therefor

-- responses --.

Signed and Sealed this

Fourteenth Day of November 1978

[SEAL]

Attest:

RUTH C. MASON
*Attesting Officer*

DONALD W. BANNER
*Commissioner of Patents and Trademarks*